United States Patent
Van Brocklin et al.

(10) Patent No.: US 6,839,275 B2
(45) Date of Patent: Jan. 4, 2005

(54) MEMORY SYSTEM HAVING CONTROL CIRCUIT CONFIGURED TO RECEIVE DATA, PROVIDE ENCODED RECEIVED DATA TO MATCH A FAULT PATTERN IN THE ARRAY OF MEMORY CELLS

(75) Inventors: Andrew L Van Brocklin, Corvallis, OR (US); Kenneth Smith, Boise, ID (US); Kenneth James Eldredge, Boise, ID (US); Peter James Fricke, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 49 days.

(21) Appl. No.: 10/454,463

(22) Filed: Jun. 4, 2003

(65) Prior Publication Data

US 2004/0246774 A1 Dec. 9, 2004

(51) Int. Cl.[7] .............................................. G11C 11/15
(52) U.S. Cl. .................. 365/173; 365/200; 365/189.07
(58) Field of Search ................................. 365/173, 200, 365/189.02

(56) References Cited

U.S. PATENT DOCUMENTS

| | | | |
|---|---|---|---|
| 4,669,082 A | * | 5/1987 | Tilghman et al. ........... 365/201 |
| 5,343,426 A | | 8/1994 | Cassidy et al. |
| 5,682,349 A | | 10/1997 | Campardo et al. |
| 5,734,919 A | * | 3/1998 | Walsh et al. ........... 365/185.13 |
| 6,345,367 B1 | | 2/2002 | Sinclair |
| 6,418,068 B1 | | 7/2002 | Raynham |
| 6,430,702 B1 | | 8/2002 | Santeler et al. |
| 6,505,305 B1 | | 1/2003 | Olarig |
| 6,549,446 B2 | * | 4/2003 | Morely et al. ................. 365/97 |

* cited by examiner

*Primary Examiner*—Michael S. Lebentritt
*Assistant Examiner*—Tuan T. Nguyen

(57) ABSTRACT

Embodiments of the present invention provide a memory system. In one embodiment, the memory system comprises an array of memory cells, a write circuit configured to write memory cells in the array of memory cells and a control circuit. The control circuit is configured to receive data, provide encoded received data to match a fault pattern in the array of memory cells, and control the write circuit to write the encoded received data into the array of memory cells at a fault address of the fault pattern.

34 Claims, 5 Drawing Sheets

MEMORY SYSTEM HAVING CONTROL CIRCUIT CONFIGURED TO RECEIVE DATA, PROVIDE ENCODED RECEIVED DATA TO MATCH A FAULT PATTERN IN THE ARRAY OF MEMORY CELLS

BACKGROUND OF THE INVENTION

A memory system can include volatile memory and non-volatile memory. Volatile memory includes dynamic random access memory (DRAM) and static random access memory (SRAM). Non-volatile memory includes reprogrammable memory, such as erasable programmable read only memory (EPROM), electrically erasable programmable read only memory (EEPROM) and FLASH EEPROM memory.

Another type of non-volatile, reprogrammable memory known in the art includes magnetic memory cells. These devices, known as magnetic random access memory (MRAM) devices, include an array of magnetic memory cells. The magnetic memory cells may be of different types. For example, the memory cells can be magnetic tunnel junction (MTJ) memory cells or giant magnetoresistive (GMR) memory cells.

Generally, a magnetic memory cell includes a layer of magnetic film in which the orientation of magnetization is alterable and a layer of magnetic film in which the orientation of magnetization may be fixed or "pinned" in a particular direction. The magnetic film having alterable magnetization is referred to as a sense layer or data storage layer and the magnetic film that is fixed is referred to as a reference layer or pinned layer. In an MTJ memory cell, a barrier layer separates the sense layer and the reference layer.

Conductive traces referred to as word lines and bit lines are routed across the array of memory cells. Word lines extend along rows of the memory cells, and bit lines extend along columns of the memory cells. A bit of information is stored in a memory cell as an orientation of magnetization in a sense layer at each intersection of a word line and a bit line. The orientation of magnetization in the sense layer aligns along an axis of the sense layer referred to as its easy axis. The orientation of magnetization does not easily align along an axis orthogonal to the easy axis, referred to as the hard axis. Magnetic fields are applied to flip the orientation of magnetization in the sense layer along its easy axis to either a parallel or anti-parallel orientation with respect to the orientation of magnetization in the reference layer.

In one configuration, the word lines and bit lines are routed across the array of memory cells to aid in flipping the orientation of magnetization in sense layers. The word lines extend along rows of the memory cells near the sense layers. The bit lines extend along columns of the memory cells near the reference layers. The word lines and bit lines are electrically coupled to a write circuit.

During a write operation, the write circuit selects one word line and one bit line to change the orientation of magnetization in the sense layer of the memory cell situated at the conductors crossing point. The write circuit supplies write currents to the selected word line and bit line to create magnetic fields in the selected memory cell. The magnetic fields combine to set or switch the orientation of magnetization in the selected memory cell.

The resistance through a memory cell differs according to the parallel or anti-parallel orientation of magnetization of the sense layer and the reference layer. The resistance is highest when the orientation is anti-parallel, which can be referred to as the logic "1" state, and lowest when the orientation is parallel which can be referred to as the logic "0" state. The resistive state of the memory cell can be determined by sensing the resistance through a memory cell.

Word lines and bit lines aid in sensing the resistance through a memory cell. Word lines, which extend along rows, are electrically coupled to reference layers. Word lines and bit lines are also electrically coupled to a read circuit to sense the resistance through and state of a memory cell.

During a read operation, the read circuit selects one word line and one bit line to sense the resistance of the memory cell situated at the conductors crossing point. The read circuit can supply a voltage across the selected memory cell to generate a current though the memory cell. The current through the memory cell is proportional to the resistance through the memory cell and is used to differentiate a high resistive state from a low resistive state.

Although a magnetic memory is generally reliable, failures can occur that affect the ability of memory cells to store data in both resistive states. For example, failures occur causing a defective memory cell to be fixed in a high resistive state or a low resistive state. A defective memory cell having a fixed state is referred to as a hard fault.

Hard faults include physical failures of memory cells. Physical failures within a memory device can result from many causes including manufacturing imperfections and aging of the device. Failure mechanisms take many forms including shorted memory cells and opened memory cells. A shorted memory cell has a resistance value that is much lower than expected. An opened memory cell has a resistance value that is much higher than expected. Shorted and opened memory cells can affect other memory cells lying in the same row and the same column.

Hard faults limit the ability of memory cells to store data in both resistive states. Memory cells affected by hard faults may not be used. Not using memory cells reduces the number of memory cells available for storing data and increases per bit storage cost.

SUMMARY OF THE INVENTION

Embodiments of the present invention provide a memory system. In one embodiment, the memory system comprises an array of memory cells, a write circuit configured to write memory cells in the array of memory cells and a control circuit. The control circuit is configured to receive data, provide encoded received data to match a fault pattern in the array of memory cells, and control the write circuit to write the encoded received data into the array of memory cells at a fault address of the fault pattern.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
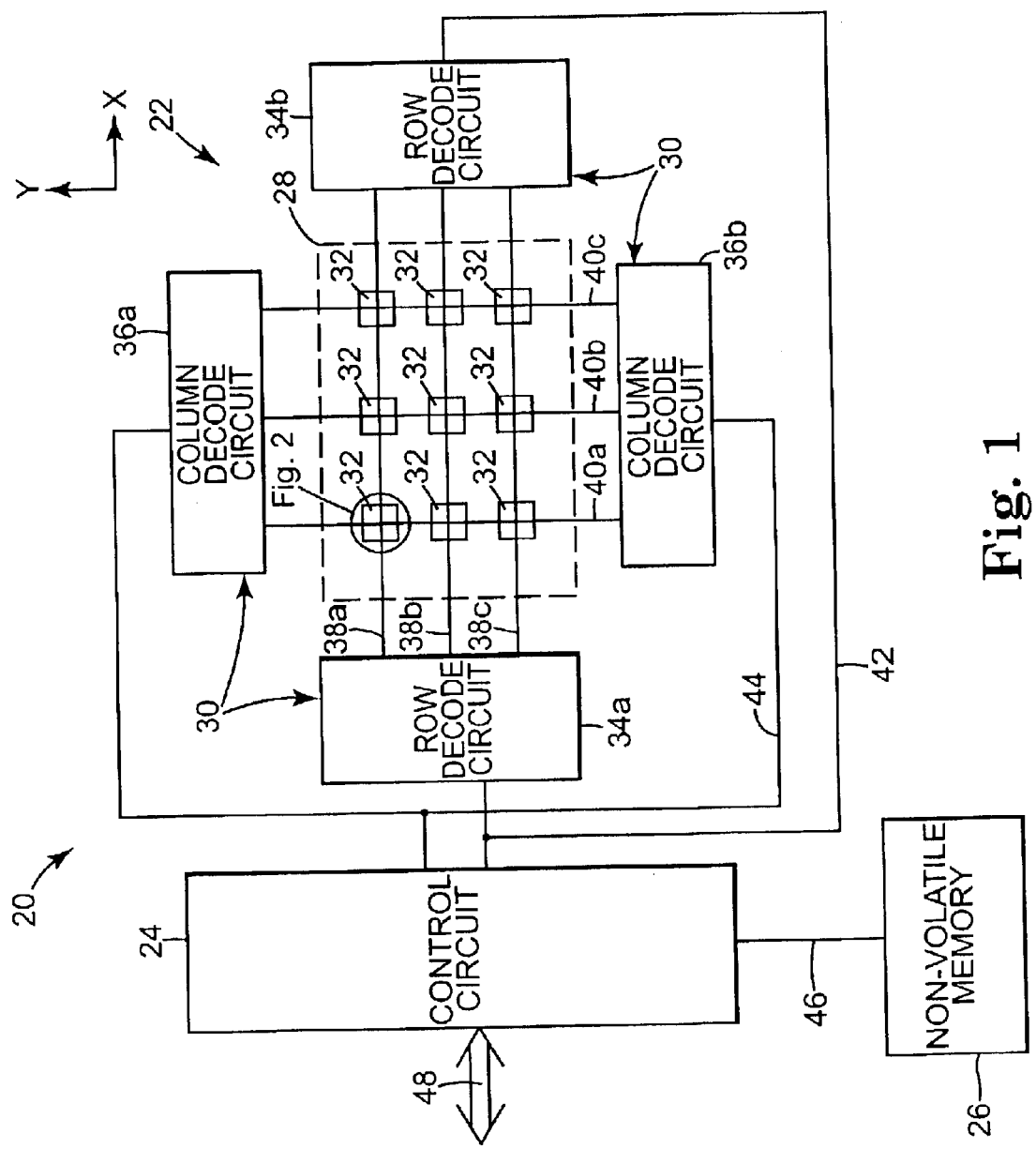
FIG. 1 is a diagram illustrating an exemplary embodiment of a memory system, according to an exemplary embodiment of the present invention.

FIG. 1 is a diagram illustrating an exemplary embodiment of a memory system 20, according to an embodiment of the present invention. The memory system 20 includes a magnetic memory 22, a control circuit 24 and a non-volatile memory, such as EEPROM, indicated at 26. The magnetic memory 22 includes a memory cell array 28 and a read/write circuit, indicated at 30. The memory cell array 28 is a magnetic memory cell array including magnetic memory cells 32. The array 28 is coupled to the read/write circuit 30 that includes a read circuit and a write circuit. The control circuit 24 is electrically coupled to the read/write circuit 30 and non-volatile memory 26.

The control circuit 24 receives data and provides a data pattern from the received data. The data pattern is compared to fault patterns that are patterns of hard faults in array 28. In the event the data pattern matches a fault pattern, the control circuit 24 controls the read/write circuit 30 to write the data pattern into the array 28 at the location with the matching fault pattern. That is, the data pattern is written over the matching fault pattern, such that bit logic values in the data pattern align with corresponding similar hard fault logic values in the fault pattern. The memory cells with hard faults are used to store data.

In the exemplary embodiment, control circuit 24 encodes the received data in various ways and provides the encoded received data as the data pattern. In one type of encoding, the received data is left unchanged and provided as the data pattern. In other types of encoding, the received data is rearranged, inverted, convoluted or operated on by a mathematical operation, such as a matrix multiply. In each type of encoding, the original received data can be recovered from the encoded received data. After each encoding, the encoded received data is provided as the data pattern and compared to fault patterns in an attempt to match a fault pattern. Where the encoded received data matches a fault pattern, the encoded received data is written into the array 28 at the address of the fault pattern. The encoded received data including encoding information that indicates the type of encoding used to encode the stored data pattern is written to the array 28. In other embodiments, the encoding information can be stored in another memory, such as non-volatile memory 26.

The control circuit 24 is configured to control the read/write circuit 30 to read stored data, i.e., the encoded received data also referred to as the data pattern, including encoding information from array 28. The control circuit 24 uses the encoding information to decode the data read from array 28 and recover the original received data.

The memory cells 32 in array 28 are arranged in rows and columns, with the rows extending along an x-direction and the columns extending along a y-direction. Only a relatively small number of memory cells 32 are shown to simplify the illustration of magnetic memory 22. In practice, arrays of any suitable size are used and the arrays can be stacked to form 3-dimensional macro-array structures that operate in highly parallel modes.

In one suitable 128 M byte macro-array, 1024 arrays are arranged in a macro-array that is 16 arrays high, by 16 arrays wide, with four stack layers. Each individual array is a one M bit array that is 1024 memory cells high by 1024 memory cells wide. Optionally, the magnetic memory comprises more than one such macro-array.

In one suitable addressing scheme for the 128 M byte array, memory cells are accessed by selecting one word line in each of a plurality of arrays and by selecting multiple bit lines in each of the plurality of arrays. Selecting multiple bit lines in each array, selects multiple memory cells from each array. The accessed memory cells within each of the plurality of arrays correspond to a small portion of a unit of data. Together, the accessed memory cells provide a whole unit of data, such as a sector of 512 bytes, or at least a substantial portion of a whole unit of data. The memory cells are accessed substantially simultaneously.

In the exemplary embodiment, the read/write circuit 30 includes row decode circuits 34a and 34b, and column decode circuits 36a and 36b. The row decode circuits 34a and 34b are electrically coupled to word lines 38a–38c. The column decode circuits 36a and 36b are electrically coupled to bit lines 40a–40c. The conductive word lines 38a–38c extend along the x-direction in a plane on one side of array 28. The conductive bit lines 40a–40c extend along the y-direction in a plane on an opposing side of array 28. There is one word line 38a–38c for each row of the array 28, and one bit line 40a–40c for each column of the array 28. A memory cell 32 is located at each cross-point of a word line 38a–38c and a bit line 40a–40c.

During a write operation, the read/write circuit 30 selects one word line 38a–38c and one bit line 40a–40c to set or switch the orientation of magnetization in the sense layer of the memory cell 32 located at the cross-point of the selected word line 38a–38c and bit line 40a–40c. The row decode circuits 34a and 34b select one word line 38a–38c, and the column decode circuits 36a and 36b select one bit line 40a–40c. The row decode circuits 34a and 34b provide a word write current through the selected word line 38a–38c from row decode circuit 34a to row decode circuit 34b, or vice-versa. The column decode circuits 36a and 36b provide a bit write current through the selected bit line 40a–40c from column decode circuit 36a to column decode circuit 36b, or vice-versa. The word and bit write currents create magnetic fields, according to the right hand rule, around the selected word line 38a–38c and bit line 40a–40c, and in the selected memory cell 32. These magnetic fields combine to set or switch the state of the selected memory cell 32.

The read/write circuit 30 is electrically coupled to word lines 38a–38c and bit lines 40a–40c. The read/write circuit 30 is configured to sense the resistance through a selected memory cell 32 and provide a logic level output corresponding to the resistive state of the selected memory cell 32. Where a selected memory cell 32 is shorted, the logic level output corresponds to the low resistive state and where the selected memory cell 32 is opened, the logic level output corresponds to the high resistive state.

During a read operation, the read/write circuit 30 selects one word line 38a–38c and one bit line 40a–40c to sense the resistance through the memory cell 32 located at the cross-point of the selected word line 38a–38c and bit line 40a–40c. In the exemplary embodiment, the read/write circuit 30 provides a voltage on the selected word line 38a–38c and a sense current through the selected word line 38a–38c and memory cell 32 to the selected bit line 40a–40c. The magnitude of the sense current indicates the resistive state of the selected memory cell 32. The read/write circuit 30 provides a logic level output signal to control circuit 24 indicating the resistive state of the selected memory cell 32.

In another embodiment, the read/write circuit 30 provides a constant voltage on the selected bit line 40a–40c and a sense current though the selected bit line 40a–40c and the selected memory cell 32 to the selected word line 38a–38c that is electrically coupled to ground. The magnitude of the sense current through the selected memory cell 32 corresponds to the resistive state of the selected memory cell 32. The read/write circuit 30 senses the magnitude of the sense current and provides a logic level output signal to the control circuit 24 corresponding to the resistive state of the selected memory cell 32.

The control circuit 24 is electrically coupled to read/write circuit 30 and non-volatile memory 26. The control circuit 24 is electrically coupled to row decode circuits 34a and 34b through row decode bus 42. The control circuit 24 is electrically coupled to column decode circuits 36a and 36b through column decode bus 44. In addition, the control circuit 24 is electrically coupled to non-volatile memory 26 through memory bus 46.

The control circuit 24 controls read/write circuit 30 to write data into array 28 and read data from array 28. The control circuit 24 provides a write address and a data pattern to read/write circuit 30 to write the data pattern into array 28 at the provided address. The control circuit 24 provides a read address to the read/write circuit 30 to read data from array 28 at the provided address. The provided address points to a section of data. In one embodiment, the section is a sector of data including 512 bytes. In other embodiments, the section can be any number of bits, such as one bit, a byte, a sector including a different number of bytes and a block including multiple sectors, such as 16 or 32 sectors.

Non-volatile memory 26 stores two memory maps. One memory map is a fault map and the other is an address map. The fault map includes addresses and fault patterns of hard faults in array 28. The address map is a table listing an original address, which is the write or read address provided by external circuitry for addressing sections in array 28, and a corresponding address, which indicates where the section of data is in magnetic memory 22.

During a write operation, control circuit 24 receives an original write address and data through input/output path 48. Control circuit 24 encodes the received data and compares the encoded received data to fault patterns in the fault map in non-volatile memory 26. The encoded received data is provided as a data pattern, which is compared to the fault patterns. In the event the data pattern matches a fault pattern, control circuit 24 controls read/write circuit 30 to write the data pattern including the encoding information into array 28 at the fault address of the matching fault pattern. Control circuit 24 writes the original write address and the corresponding fault address into the address map in non-volatile memory 26.

In the event no match is found, the received data is stored in array 28 at the original write address, unless the original write address is a fault pattern address or used. In these situations, the received data is stored in the next available address. In every situation, the original write address and the corresponding address that indicates where the received data is written in array 28, are stored in the address map.

The control circuit 24 is configured to try multiple encoding techniques on the received data to match the encoded received data to a fault pattern. Each encoding technique is used in turn, with control circuit 24 comparing the encoded received data to the fault patterns after each encoding. Where a match is found, the control circuit 24 provides the data pattern with the encoding information to read/write circuit 30 that writes the data pattern with encoding information into array 28. Encoding techniques include using the received data without changes, rearranging the received data, inverting the received data, convoluting the received data or performing a mathematical operation on the received data. In other embodiments different encoding techniques can be used.

During a read operation, control circuit 24 receives an original read address at input/output path 48 to read data from array 28 at the original read address. Control circuit 24 looks up the original read address in the address map and retrieves the corresponding address from the address map. The control circuit 24 controls the read/write circuit 30 to read the data pattern and encoding information from array 28 at the corresponding address. Using the encoding information, control circuit 24 decodes the data pattern and provides the original received data at input/output path 48.

Figure 2:
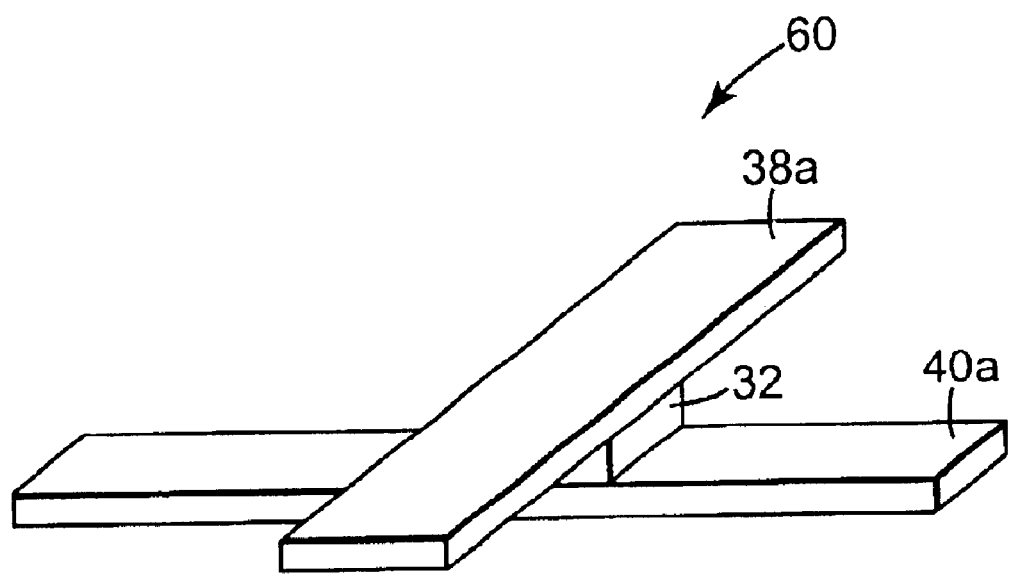
FIG. 2 is a diagram illustrating an exemplary embodiment of an array section.

FIG. 2 is a diagram illustrating an exemplary embodiment of an array section, indicated at 60. Array section 60 includes a word line 38a, memory cell 32 and a bit line 40a. Memory cell 32 is located between word line 38a and bit line 40a. In the exemplary embodiment, word line 38a and bit line 40a are orthogonal to one another. In other embodiments, word line 38a and bit line 40a can lie in other suitable angular relationships to one another.

Figure 3:
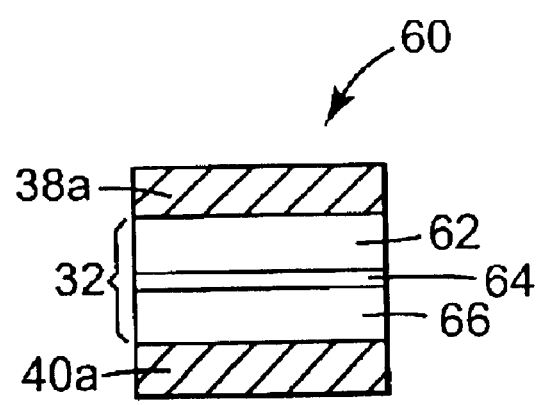
FIG. 3 is a diagram illustrating a cross-section of the exemplary embodiment of an array section.

FIG. 3 is a diagram illustrating a cross-section of the exemplary embodiment of array section 60. Array section 60 includes memory cell 32 located between word line 38a and bit line 40a. Memory cell 32 includes a sense layer 62, a spacer layer 64 and a reference layer 66. The spacer layer 64 is located between the sense layer 62 and the reference layer 66. The sense layer 62 is located next to word line 38a. The reference layer 66 is located next to bit line 40a. The sense layer 62 has an alterable orientation of magnetization and the reference layer 66 has a pinned orientation of magnetization. In this embodiment, memory cell 32 is an MTJ spin-tunneling device and spacer layer 64 is an insulating barrier layer through which an electrical charge migrates during read operations. Electrical charge migrations through spacer layer 64 occur in response to a voltage across memory cell 32 and a sense current through memory cell 32. In an alternative embodiment, a GMR structure can be used for memory cell 32 with the spacer layer 64 being a conductor, such as copper.

Figure 4:
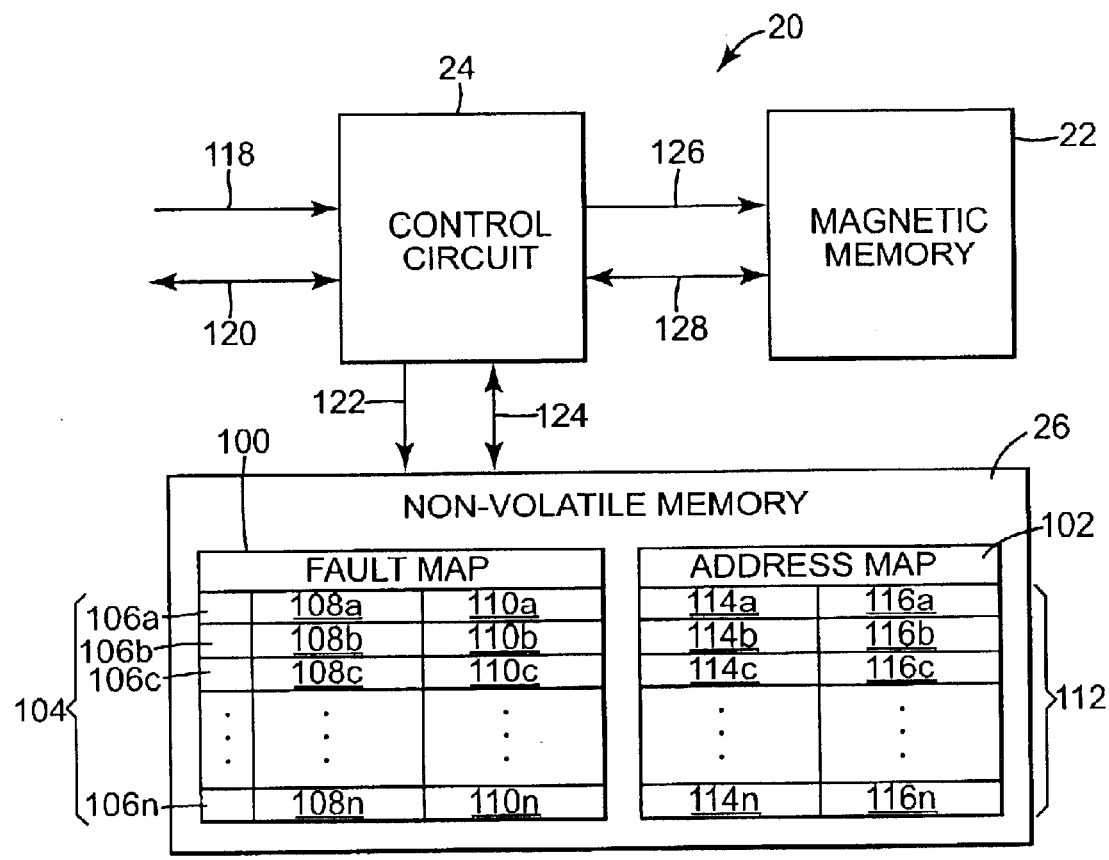
FIG. 4 is a block diagram illustrating an exemplary embodiment of a memory system.

FIG. 4 is a block diagram illustrating an exemplary embodiment of memory system 20, according to an embodiment of the present invention. Memory system 20 includes magnetic memory 22, control circuit 24 and non-volatile memory 26. Magnetic memory 22 includes memory cell array 28 and read/write circuit 30. The control circuit 24 controls the read/write circuit 30 to write and read array 28.

In the exemplary embodiment, the control circuit 24 is a controller including control logic and a program. The program is stored in the controller and non-volatile memory 26. In other embodiments, the control circuit 24 can be multiple controllers, such as a first controller for encoding and writing, and a second controller for reading and decoding. In other embodiments, the control circuit 24 can be control logic configured to perform encoding, writing, reading and decoding functions.

The non-volatile memory 26 stores the fault map 100 and the address map 102. In the exemplary embodiment, the non-volatile memory 26 is EEPROM. In other embodiments, the non-volatile memory can be FLASH EEPROM a magnetic memory or other types of non-volatile memory. In other embodiments, fault map 100 and address map 102 can be stored in magnetic memory 22.

The fault map 100 includes fault pattern entries, illustrated in rows at 104. Each fault pattern entry 104 includes a status bit 106a–106n, a section address 108a–108n, i.e. a fault address, and a fault pattern 110a–110n. The section address 108a–108n is the address in magnetic memory 22 where the corresponding fault pattern 110a–110n is situated. In the exemplary embodiment, each section address 108a–108n points to a sector of 512 bytes. In other embodiments, each section address 108a–108n can point to a sector of any suitable size or a block of memory including multiple sectors of any suitable size.

Each fault pattern 110a–110n includes a pattern of hard faults and functional memory cells 32. A fault pattern 110a–110n is addressed at the corresponding section address 108a–108n. The hard faults are memory cells 32 stuck at a high or low resistance level, such as shorted or opened memory cells 32. Each status bit 106a–106n indicates whether or not the corresponding fault section address 108a–108n is unused, a logic "0", or written with data, a logic "1".

The fault map 100 is created by writing and reading magnetic memory cells 32 in magnetic memory 22 multiple times. The memory cells 32 are written to a high resistive state and read. Next, the memory cells 32 are written to a low resistive state and read. Memory cells 32 that remain in a single resistive state are flagged as hard faults. Section addresses 108 and fault patterns 110 are written to fault map 100 in non-volatile memory 26. Control circuit 24 detects hard faults and updates fault map 100.

The address map 102 includes swapped address entries, illustrated in rows at 112. Each swapped address entry 112 includes an original address 114a–114n and a corresponding address 116a–116n. The original address 114a–114n is the address location addressed by external circuits for writing and reading the magnetic memory 22. The original address 114a–114n is a write address provided by external circuits during a write operation and a read address provided by external circuits during a read operation. The corresponding address 116a–116n is the actual address in magnetic memory 22 where the data pattern is stored. The corresponding address 116a–116n is provided by control circuit 24.

The address map 102 is created as memory system 20 stores data in the magnetic memory 22. The control circuit 24 writes address map 102 with each original address 114a–114n and corresponding address 116a–116n.

During a write operation, control circuit 24 receives a write address on path 118 and data on path 120. The control circuit 24 encodes the received data to obtain a data pattern, which is compared to the fault patterns 110. The control circuit 24 is configured to encode the received data in a number of different ways. After each encoding, the encoded received data is compared to the fault patterns 110.

In the exemplary embodiment, the control circuit 24 in a first encoding leaves the received data unchanged and provides the unchanged received data as the data pattern and encoded received data. The data pattern is compared to the fault patterns 110. In the event no match is found, control circuit 24 proceeds to the next encoding technique. In the exemplary embodiment, the second encoding technique includes rearranging the received data in a predetermined manner. The encoded received data is compared to the fault patterns 110. In the event no match is found, the control circuit 24 proceeds to the third encoding technique. This process continues until a match is found or all encoding techniques have been exhausted. Exemplary encoding techniques include leaving the received data unchanged, rearranging the received data, inverting the received data, convoluting the received data and performing a mathematical operation on the received data, such as a matrix multiply. In other embodiments, different encoding techniques can be used, such as combinations of the above techniques.

The control circuit 24 encodes the received data and attempts to match the encoded received data, i.e., the data pattern, to one of the fault patterns 110. Control circuit 24 provides a non-volatile memory address on path 122 and data is transferred on path 124 during communications with non-volatile memory 26. The control circuit 24 reads unused fault addresses 108 and corresponding fault patterns 110 from fault map 100 in non-volatile memory 26. The control circuit 24 compares each data pattern to the retrieved fault patterns 110. Only the fault patterns 110 at unused fault addresses 108, as indicated by status bits 106, need to be compared as the used fault addresses 108 already have data patterns stored at them.

In the event a match is found, control circuit 24 provides the fault address 108a–108n of the matching fault pattern 110a–110n, and the matching data pattern with the encoding information to magnetic memory 22. The fault address 108a–108n is provided to magnetic memory 22 on path 126 and the matching data pattern and encoding information are provided on path 128. The read/write circuit 30 in magnetic memory 22 writes the matching data pattern and encoding information to the fault address 108a–108n of the matching fault pattern 110a–110n in magnetic memory 22. The control circuit 24 marks the written fault address 108a–108n used by setting the status bit 106a–106n corresponding to the written fault address 108a–108n in fault map 100. In addition, control circuit 24 writes the address map 102 with the write address as the original address 114a–114n and the written fault address 108a–108n as the corresponding address 116a–116n. In the event no match is found, control circuit 24 checks to see if the received data can be written at the write address.

To see if the received data can be written at the write address, control circuit 24 compares the write address to each fault address 108a–108n in fault map 100. In the event of a match, the received data and encoding information are written to the next available address that does not include a fault pattern 110a–110n. To find the next available address, control circuit 24 selects an address and verifies the address is not a fault address 108a–108n or a corresponding address 116a–116n by comparing the selected address to the fault addresses 108 and corresponding addresses 116. In one embodiment, the selected address is selected from the end of magnetic memory 22, working toward the beginning of magnetic memory 22 with each successive selection. Control circuit 24 writes address map 102 to include an entry 112 with the write address as the original address 114a–114n and the next available address as the corresponding address 116a–116n. In the event the write address is not a fault address 108a–108n, control circuit 24 checks to see if the write address is used.

Control circuit 24 compares the write address to each corresponding address 116a–116n in address map 102. If a match is found, the write address is in use and control circuit 24 stores the received data and encoding information in the next available address and updates address map 102. The address map 102 is written with the write address as the original address 114a–114n and the next available address as the corresponding address 116a–116n.

In the event the write address is not used, the received data and encoding information are stored at the write address. The address map 102 is written with the write address as the original address 114a–114n and the write address as the corresponding address 116a–116n. Processing continues with memory system 20 receiving a write or read instruction.

During a read operation, control circuit 24 receives a read address on path 118. The control circuit 24 compares the read address to each original address 114a–114n in address map 102. In the event of a match, control circuit 24 provides the corresponding address 116a–116n of the matching original address 114a–114n to the read/write circuit 30 in magnetic memory 22. The read/write circuit 30 reads the data at the provided corresponding address 116a–116n including the data pattern with the encoding information. The read/write circuit 30 provides the data including encoding information to control circuit 24 on path 128.

Control circuit 24 receives the data including the data pattern with encoding information, and decodes the data pattern according to the encoding information. Decoding includes reversing the encoding process to recover the original received data. The original received data is provided by control circuit 24 on path 120.

In the event the read address is not found in address map 102, control circuit 24 provides the read address to magnetic memory 22, which returns data from the read address. The control circuit 24 provides the data and a flag, indicating the read address was not found in address map 102, on path 120.

Figure 5:
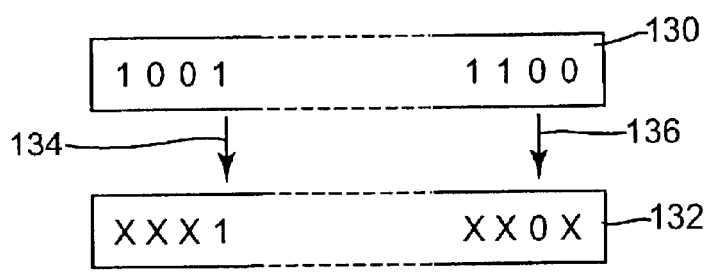
FIG. 5 is a diagram illustrating a comparison between encoded received data and a fault pattern.

FIG. 5 is a diagram illustrating a comparison between encoded received data 130 and a fault pattern 132. The encoded received data 130 and the fault pattern 132 include multiple bits. In one embodiment, the encoded received data 130 and the fault pattern 132 are similar in width and 512 bytes wide. The fault pattern 132 includes functional memory cell bits marked with an X and hard fault logic levels marked with a "0" or a "1".

For the encoded received data 130 and the fault pattern 132 to match, each hard fault logic level in the fault pattern 132 must line up with a similar bit logic level in the encoded received data 130. In the illustrated example, the logic "1" hard fault lines up with the logic "1" bit at 134 and the logic "0" hard fault lines up with the logic "0" bit at 136. With all other bits as functional X's and don't care bits, the encoded received data 130 matches the fault pattern 132. The encoded received data 130 is stored into array 28 at the fault address of the fault pattern 132. In other words, the encoded received data 130 including the encoding information that is attached as a byte of data with the rest of the encoded received data 130 is stored over the fault pattern 132.

Figure 6:
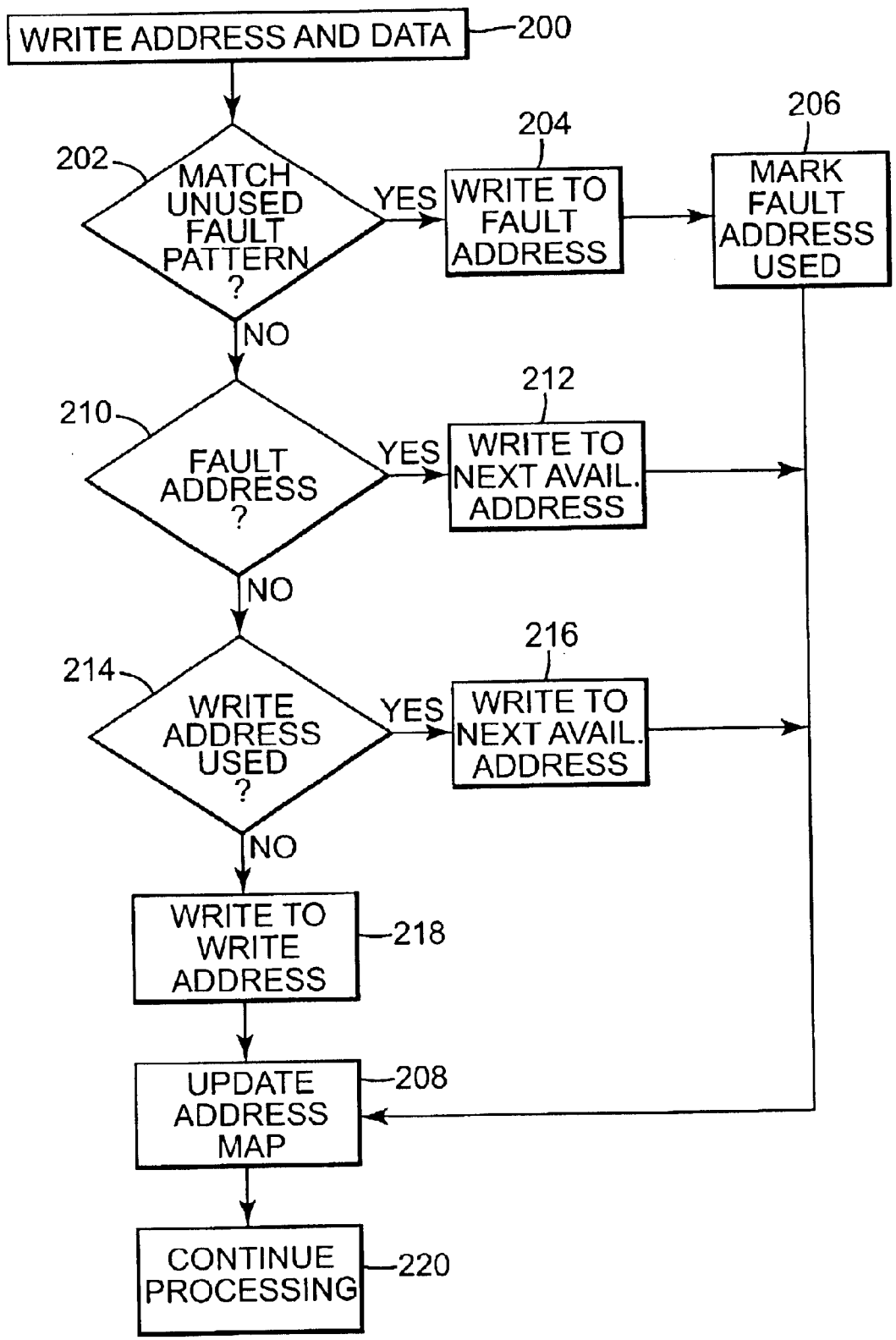
FIG. 6 is a flow chart illustrating an exemplary write operation.

FIG. 6 is a flow chart illustrating an exemplary write operation. To begin the write operation, a write address and data are provided to control circuit 24 at 200. The write address and data are provided by external circuits for storing the data in memory system 20 at the provided write address. The control circuit 24 encodes the received data and attempts to match unused fault patterns 110 to the encoded received data at 202. The control circuit 24 encodes the received data using a series of encoding techniques until a match is found or all encoding techniques have been exhausted.

In the event the encoded received data is matched to a fault pattern 100a–110n at 202, control circuit 24 writes the data pattern, also referred to as the encoded received data, including the encoding information to the fault address 108a–108n of the matching fault pattern 110a–110n at 204.

In addition, control circuit 24 marks the written fault address 108a–108n as used by setting the corresponding status bit 106a–106n at 206. Address map 102 is written with the write address as the original address 114a–114n and the fault address 108a–108n as the corresponding address 116a–116n at 208. Processing continues with a write operation or a read operation at 220. In the event the encoded received data does not match any of the fault patterns 110 at 202, control circuit 24 checks to see if the received data can be written at the write address.

The control circuit 24 checks to see if the write address matches one of the fault addresses 108 at 210. Where the write address matches a fault address 108a–108n, the data cannot be written to the write address and it is written to the next available address at 212. At this point, the received data does not need to be encoded and encoding information stored with the received data at the next available address indicates that no encoding has taken place. The control circuit 24 finds the next available address by selecting an address in a predetermined manner, and checking that the selected address is not one of the fault addresses 108 or corresponding addresses 116. After finding the next available address, control circuit 24 writes the received data and encoding information to the next available address at 212. The address map 102 is updated with the write address as the original address 114a–114n and the written next available address as the corresponding address 116a–116n at 208. Processing continues with a write operation or a read operation at 220.

In the event the write address does not match one of the fault addresses 108 at 210, control circuit 24 checks to see if the write address is used at 214. Control circuit 24 compares the write address to the corresponding addresses 116 in address map 102. If a match is found between the write address and a corresponding address 116a–116n, control circuit 24 writes the received data and encoding information to the next available address at 216. The control circuit 24 updates the address map 102 with the write address as the original address 114a–114n and the next available address as the corresponding address 116a–116n at 208. Processing continues with a write operation or a read operation at 220.

In the event the write address is not used at 214, control circuit 24 writes the received data and encoding information to the write address at 218. Control circuit 24 writes address map 102 with the write address as the original address 114a–114n and the write address also as the corresponding address 116a–116n at 208. Processing continues with a write operation or a read operation at 220.

Figure 7:
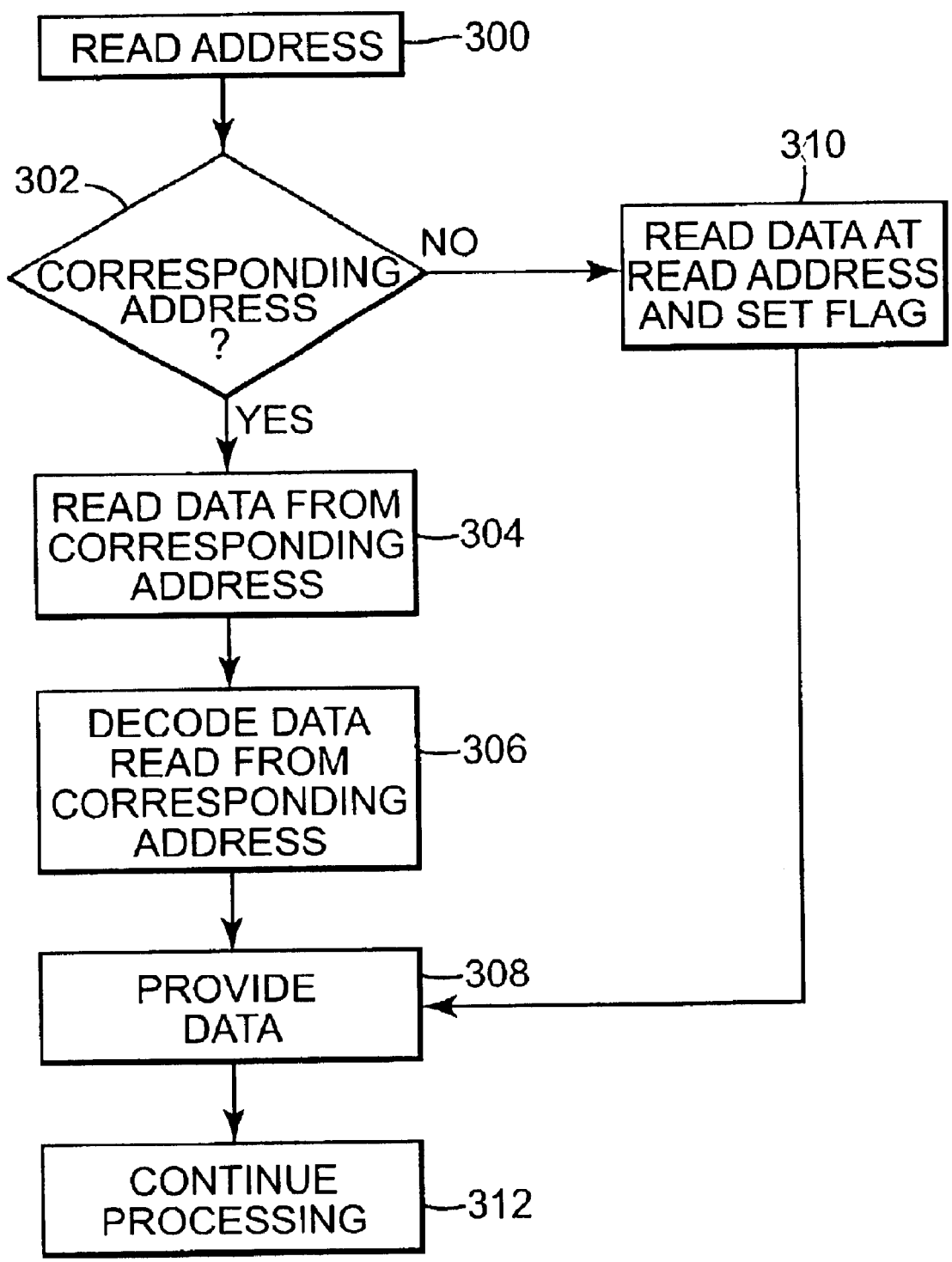
FIG. 7 is a flow chart illustrating an exemplary read operation.

FIG. 7 is a flowchart illustrating an exemplary read operation. To begin a read operation, a read address is provided to control circuit 24 at 300. The control circuit 24 tries to find a corresponding address 116a–116n for the read address at 302. To find a corresponding address 116a–116n, control circuit 24 compares the read address to each original address 114a–114n in address map 102.

In the event the read address matches an original address 114a–114n, control circuit 24 retrieves the corresponding address 116a–116n. At 304, control circuit 24 reads data including the data pattern and encoding information from the magnetic memory 22 at the retrieved corresponding address 116a–116n. At 306, control circuit 24 decodes the data pattern using the encoding information. The control circuit 24 provides decoded data, which is the original received data, at 308. Processing continues with a write operation or a read operation at 312.

In the event the read address does not match an original address 114a–114n, control circuit 24 reads data at the read address and sets a flag indicating that the read address does not match an original address 114a–114n, at 310. The control circuit 24 provides the data and the flag to external circuitry at 308. Processing continues with a write operation or a read operation at 312.

What is claimed is:

1. A memory system, comprising:
   an array of memory cells;
   a write circuit configured to write memory cells in the array of memory cells; and
   a control circuit configured to receive data, provide encoded received data to match a fault pattern in the array of memory cells, and control the write circuit to write the encoded received data into the array of memory cells at a fault address of the fault pattern.

2. The memory system of claim 1, where the control circuit is configured to provide encoded received data comprising the received data.

3. The memory system of claim 1, where the control circuit is configured to provide encoded received data comprising rearranged received data.

4. The memory system of claim 1, where the control circuit is configured to provide encoded received data comprising inverted received data.

5. The memory system of claim 1, where the control circuit is configured to provide encoded received data comprising the received data encoded with a mathematical operation.

6. The memory system of claim 1, where the control circuit is configured to provide encoded received data comprising convoluted received data.

7. The memory system of claim 1, where the control circuit is configured to provide encoded received data comprising the received data encoded with a matrix multiply.

8. The memory system of claim 1, where the control circuit is configured to provide encoding information to the write circuit that writes the encoded received data comprising the encoding information into the array of memory cells at the fault address of the fault pattern.

9. The memory system of claim 1, where the fault pattern is stored in a fault map of the array of memory cells.

10. The memory system of claim 1, where the fault pattern is marked as used as the encoded received data is written into the array of memory cells at the fault address of the fault pattern.

11. The memory system of claim 1, where the control circuit is configured to receive a write address for writing the received data to the write address, control the write circuit to write the encoded received data to the fault address and write an address map to indicate the write address corresponds to the fault address.

12. The memory system of claim 1, comprising a read circuit configured to read memory cells in the array of memory cells, where the control circuit is configured to receive a read address for reading the array of memory cells, look up the read address and a corresponding fault address and control the read circuit to read at the corresponding fault address.

13. The memory system of claim 1, comprising a read circuit configured to read memory cells in the array of memory cells, where the control circuit is configured to receive encoded received data comprising encoding information from the array of memory cells and decode the encoded received data using the encoding information to obtain the received data.

14. A memory system, comprising:
   a magnetic memory; and
   a control circuit configured to compare a data pattern to a fault pattern in a section of the magnetic memory and write the data pattern to the section of the magnetic memory if the data pattern matches the fault pattern.

15. The memory system of claim 14, where the control circuit is configured to retrieve the fault pattern from a fault map that is stored in non-volatile memory.

16. The memory system of claim 14, where the control circuit is configured to retrieve a fault address of the section of the magnetic memory from a fault map that is stored in non-volatile memory to write the data pattern into the magnetic memory at the fault address.

17. The memory system of claim 14, where the control circuit is configured to store a fault address of the section of the magnetic memory in an address map that is stored in non-volatile memory.

18. The memory system of claim 14, where the control circuit is configured to retrieve a fault address of the section of the magnetic memory from an address map that is stored in non-volatile memory to read the data pattern from the magnetic memory.

19. The memory system of claim 14, where the control circuit is configured to receive data and provide encoded received data as the data pattern.

20. The memory system of claim 14, where the control circuit is configured to provide encoding information that indicates encoding of the data pattern as part of the data pattern to compare to the fault pattern.

21. The memory system of claim 14, where the control circuit is configured to receive data and a write address, encode the received data to provide the data pattern, and in the event the data pattern matches the fault pattern, write the data pattern to a fault address of the section of the magnetic memory and provide an address map entry indicating the write address corresponds to the fault address.

22. The memory system of claim 14, where the control circuit is configured to read the magnetic memory, receive the data pattern with encoding information and decode the data pattern using the encoding information.

23. A magnetic memory, comprising:
   means for encoding received data;
   means for matching the encoded data to fault patterns in sections of the magnetic memory; and
   means for storing the encoded data at matching fault pattern locations in the magnetic memory.

24. The magnetic memory of claim 23, where the means for encoding received data is configured to change a bit pattern of the received data.

25. The magnetic memory of claim 23, where the means for encoding received data is configured to leave bit patterns of the received data as received.

26. The magnetic memory of claim 23, where the means for encoding received data is configured to provide a plurality of encoding schemes for encoding the received data.

27. The magnetic memory of claim 23, where the means for matching the encoded data is configured to compare the received data encoded in a plurality of encoding schemes.

28. The magnetic memory of claim 23, where the means for storing the encoded data is configured to store the encoded data comprising encoding information at the matching fault pattern locations in the magnetic memory.

29. A method of storing data in a memory, comprising:
receiving data;
matching the received data to hard faults in a section of the memory; and
writing the matched received data into the section of the memory.

30. The method of claim 29, comprising:
providing encoding information that indicates how the received data was matched to the hard faults; and
writing the encoding information into another memory.

31. The method of claim 29, where matching the received data comprises changing the received data bit patterns to match the hard faults.

32. The method of claim 29, comprising:
receiving a write address;
writing the matched received data to a fault address that indicates the location of the section in the memory; and
writing an address map to indicate the write address corresponds to the fault address.

33. The method of claim 29, comprising:
receiving a read address;
looking up the read address and a corresponding address in an address map; and
reading the memory at the corresponding address.

34. The method of claim 29, comprising:
reading the matched received data from the memory;
reading encoding information; and
decoding the matched received data using the encoding information to obtain the received data.

* * * * *

UNITED STATES PATENT AND TRADEMARK OFFICE
CERTIFICATE OF CORRECTION

PATENT NO.         : 6,839,275 B2                                           Page 1 of 1
APPLICATION NO. : 10/454463
DATED              : January 4, 2005
INVENTOR(S)        : Andrew L Van Brocklin et al.

It is certified that error appears in the above-identified patent and that said Letters Patent is hereby corrected as shown below:

In column 2, line 5, after "through" delete "a" and insert -- the --, therefor.

In column 2, line 8, after "coupled to" insert -- sense layers and bit lines, which extend along columns, are electrically coupled to --.

In column 2, line 15, delete "though" and insert -- through --, therefor.

In column 7, lines 49-50, delete "114a-I14n" and insert -- 114a-114n --, therefor.

In column 10, line 63, delete "1116a-116n" and insert -- 116a-116n --, therefor.

Signed and Sealed this

Twentieth Day of October, 2009

David J. Kappos
*Director of the United States Patent and Trademark Office*